(12) United States Patent
Wang et al.

(10) Patent No.: US 7,255,463 B2
(45) Date of Patent: Aug. 14, 2007

(54) LIGHTING MODULE

(75) Inventors: Bily Wang, Hsin Chu (TW); Jonnie Chuang, Pan Chiao (TW); Chun-Cheng Weng, Tao Yuan Hsien (TW)

(73) Assignee: Harvatek Corporation, Hsin Chu (TW)

( * ) Notice: Subject to any disclaimer, the term of this patent is extended or adjusted under 35 U.S.C. 154(b) by 70 days.

(21) Appl. No.: 11/108,800

(22) Filed: Apr. 19, 2005

(65) Prior Publication Data

US 2006/0232983 A1    Oct. 19, 2006

(51) Int. Cl.
*B60Q 1/06* (2006.01)

(52) U.S. Cl. ............... 362/373; 362/294; 362/345; 362/800

(58) Field of Classification Search ........... 362/373, 362/294, 580, 547, 126, 218, 345, 264
See application file for complete search history.

(56) References Cited

U.S. PATENT DOCUMENTS

| | | | | |
|---|---|---|---|---|
| 2,926,934 A * | 3/1960 | Atkin | ............... | 362/382 |
| 4,935,665 A * | 6/1990 | Murata | ............... | 313/500 |
| 6,966,677 B2 * | 11/2005 | Galli | ............... | 362/373 |
| 6,974,234 B2 * | 12/2005 | Galli | ............... | 362/294 |
| 2006/0146526 A1 * | 7/2006 | Shiau | ............... | 362/205 |

* cited by examiner

*Primary Examiner*—Sandra O'Shea
*Assistant Examiner*—Zahra I. Bennett
(74) *Attorney, Agent, or Firm*—Rosenberg, Klein & Lee

(57) ABSTRACT

A light module includes a lighting unit, a heat-dissipation plate and an insulative plate. The lighting unit has a leading contact. The heat-dissipation plate contacts the lighting module closely and has a channel corresponding to the leading contact. The insulative plate is disposed under the heat-dissipation plate, and has a predetermined conductive pattern arranged thereon and a through hole corresponding to the channel. The leading contact of the lighting unit penetrates through the channel of the heat-dissipation plate and the through hole of the insulative plate to electrically connect with the predetermined conductive pattern of the insulative plate.

6 Claims, 3 Drawing Sheets

LIGHTING MODULE

BACKGROUND OF THE INVENTION

1. Field of the Invention

The present invention relates to a lighting module, and particularly relates to a lighting module with a heat-dissipation structure that is easy to assemble.

2. Background of the Invention

Electronic products are becoming increasingly lightweight and small. FIG. 1 illustrates a secure structure designed for a conventional flashlight that dissipates heat. A flashlight 1a has a cavity 11a formed inside for receiving a battery device 12a. The flashlight 1a includes conductive structures 13a and 14a arranged in a front portion and a rear portion thereof in order to sandwich and electrically connect the battery device 12a. A lighting unit 15a of the flashlight 1a connects to the conductive structure 13a so as to irradiate thereby. Due to the heat created by the irradiation of the lighting unit 15a, damage may occur to the device affecting the product's service life. An aluminum sleeve 2a is disposed to retain against the conductive structures 13a for transferring heat. In addition, to secure the lighting unit 15a in the flashlight 1a, an aluminum ring 21a with exterior screw threads is abutted against the conductive structures 13a to secure the conductive structures 13a inside the flashlight 1a. The conventional secure structure mentioned above suffers from having many complicated steps for assembling the flashlight 1a. The aluminum ring 21a should be arranged inside the flashlight 1a first to orientate the conductive structures 13a, the aluminum sleeve 2a, for heat dissipation, is then inserted, and the other components of the flashlight 1a are assembled sequentially. Furthermore, the conductive structure 13a, made from a polypropylene plate 132a, (so called PP plate) is sandwiched by two metallic plates 131 and 133a. The lighting unit 15a contacts the metallic plates 133a directly. The metallic plate 133a has a peripheral portion folding downwardly to cover and contact the opposite metallic plate 131a to dissipate the heat outwardly. The contact portions between the two metallic plates 131 and 133a are restrained by the peripheral portion and screws 134a that penetrate therethrough. After the aluminum ring 21a is positioned to contact the metallic plate 133a, another contact area therebetween is formed in an annular shape on the aluminum sleeve 2a. The heat dissipation efficiency is restrained by the contact portion between the two metallic plates 131 and 133a and the contact area between the aluminum ring 21a and the metallic plate 133a. Due to the nature of the design it is difficult to be improved thereby. In addition, the structure formed by the metallic plate 133a and the aluminum ring 21a, and between the aluminum ring 21a and the aluminum sleeve 2a, must be taken into consideration. Obviously, this structure has at least two heat chokes. The first occurs between the two metallic plates 131 and 133a, and the other occurs between the aluminum ring 21a and the metallic plate 133a.

SUMMARY OF INVENTION

A lighting module is provided that can be assembled quickly and simply that also has a large area for heat dissipation and its design has better heat dissipation efficiency than the prior art Furthermore, it requires fewer components than the prior art, thereby reducing the costs of production.

A light module includes a lighting unit, a heat-dissipation plate and an insulative plate. The lighting unit has a leading contact. The heat-dissipation plate contacts the lighting module firmly and has a channel corresponding to the leading contact. The insulative plate is disposed under the heat-dissipation plate, and has a predetermined conductive pattern arranged thereon and a through hole corresponding to the channel. The leading contact of the lighting unit penetrates through the channel of the heat-dissipation plate and the through hole of the insulative plate to electrically connect to the predetermined conductive pattern of the insulative plate.

To provide a further understanding of the invention, the following detailed description illustrates embodiments and examples of the invention. Examples of the more important features of the invention have thus been summarized rather broadly in order that the detailed description thereof that follows may be better understood, and in order that the contributions to the art may be appreciated. There are, of course, additional features of the invention that will be described hereinafter which will form the subject of the claims appended hereto.

BRIEF DESCRIPTION OF THE DRAWINGS

These and other features, aspects, and advantages of the present invention will become better understood with regard to the following description, appended claims, and accompanying drawings, where:

DETAILED DESCRIPTION OF THE EMBODIMENTS

Figure 1:
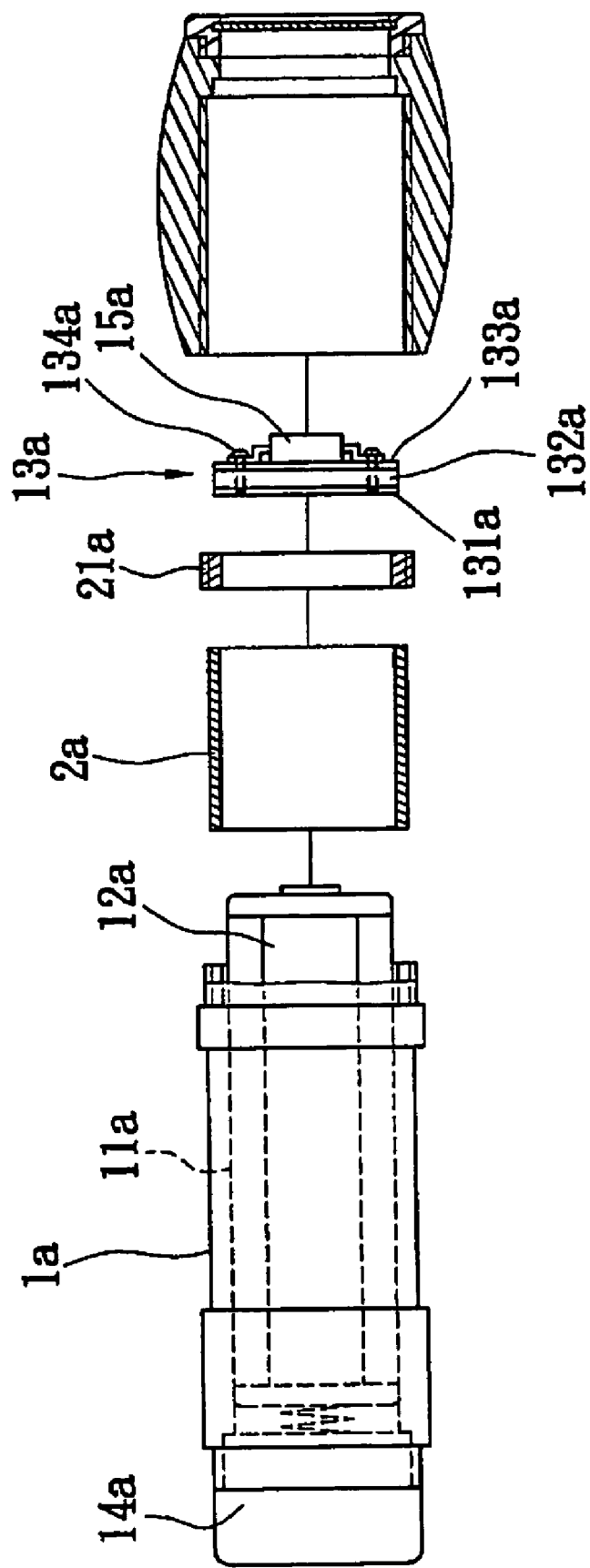
FIG. 1 is a decomposition view of a secure structure adapted for a conventional flashlight for heat dissipation.
Figure 2:
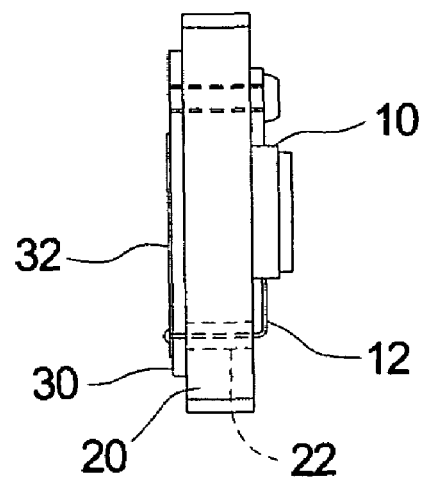
FIG. 2 is a side view of a lighting module according to the present invention.
Figure 3:
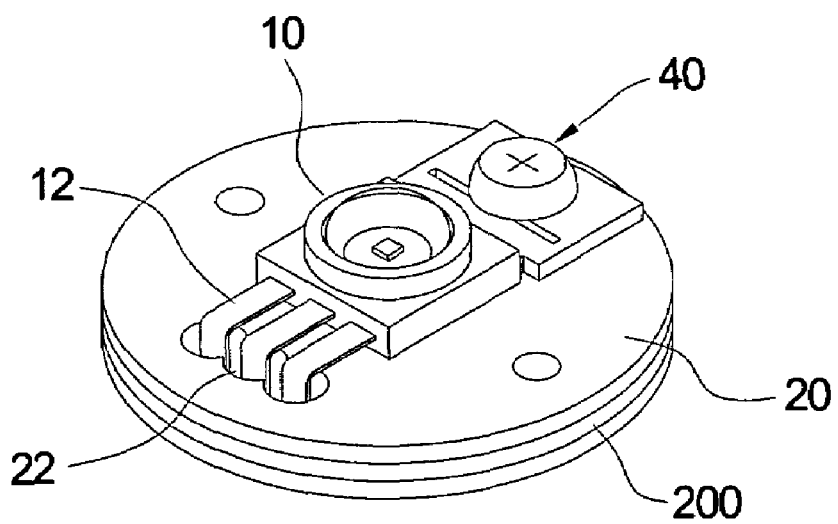
FIG. 3 is a front view of the lighting module according to the present invention.
Figure 4:
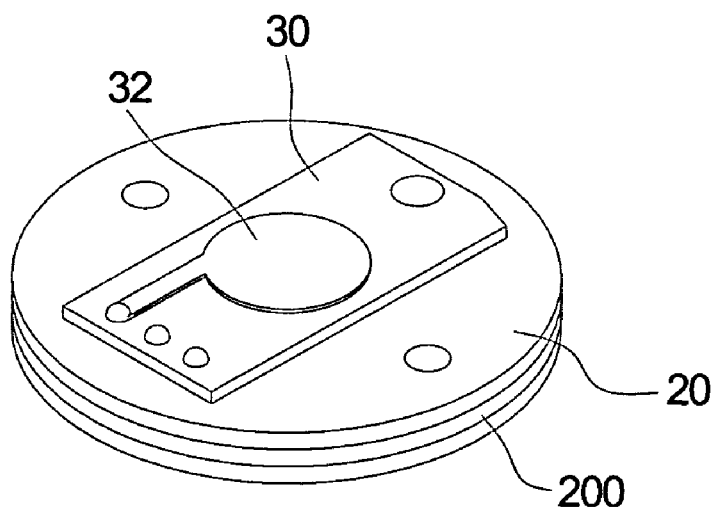
FIG. 4 is a perspective view of the lighting module according to the present invention.

With respect to FIGS. 2 to 4, a lighting module according to the present invention includes a lighting unit 10 having a lead contact 12, a heat-dissipation plate 20 contacting the lighting unit 10 firmly and an insulative plate 30 disposed under the heat-dissipation plate 20. The heat-dissipation plate 20 has a channel 22 corresponding to the leading contact 12. The insulative plate 30 has a predetermined conductive pattern 32 arranged thereon and a through hole 34 corresponding to the channel 22. The leading contact 12 of the lighting unit 10 penetrates through the channel 22 of the heat-dissipation plate 20 and the through hole 34 of the insulative plate 30 to electrically connect to the predetermined conductive pattern 32 of the insulative plate 32. Therefore, the lighting module can be treated as a whole modulized device with improved efficiency and can be used as a flashlight or another apparatus, in order to avoid the conventional secure structure that is complicated and difficult to assemble.

In addition, the heat-dissipation plate 20 contacts the lighting unit 10 firmly, a contact area being formed therebetween is determined by the sizes thereof. This contact area is different from the contact portion between the aluminum ring 21a and the metallic plate 133a, because it transfers heat and is more efficient.

In addition, the lighting unit 10, the heat-dissipation plate 20 and the insulative plate 30, which are assembled as a whole module, can be used to increase the heat dissipation efficiency without other components, such as the conventional lighting unit 15a, the polypropylene plate 132a, the metallic plate 133a, the aluminum ring 21a and the aluminum sleeve 2a, to reduce production costs.

The lead contact 12 of the lighting unit 10 can be folded to conduct the heat away from predetermined conductive pattern 32 of the insulative plate 30. Thus, the polypropylene plate 132a and the metallic plate 133a provided in the prior art were costly and excessively large.

The lighting unit 10 can include either an LED or a bulb. The lighting unit 10 can be fastened to the heat-dissipation plate 20 via screw 40.

Figure 3A:
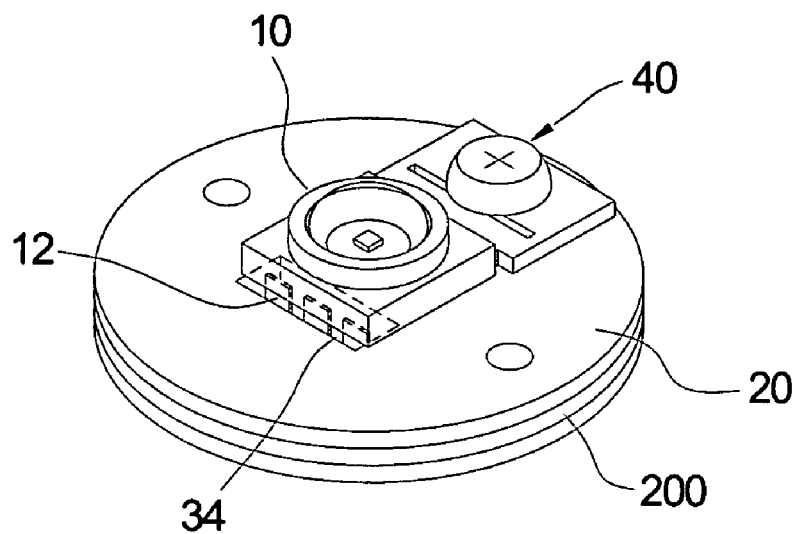
FIG. 3A is a front view of another embodiment of the lighting module according to the present invention.

The heat-dissipation plate 20 is a metallic plate made of copper or aluminum or an alloy comprised partly of copper or aluminum. In FIG. 3, a predetermined distance between the channel 22 of the heat-dissipation plate 20 and the lighting unit 10 is provided, and the lead contact 12 extends outwardly along the predetermined distance h and folds downwardly to penetrate the channel 22. Referring to FIG. 3A, the heat-dissipation plate 20 is adjacent to the lighting unit 10, and the leading contact 12 extends downwardly to penetrate the channel 22.

The heat-dissipation plate 20 further includes exterior screw threads (200) to enable the heat-dissipation plate 20 to be firmly attached to the flashlight or other illumination devices.

The insulative plate 30 is made of polypropylene materials.

According to the present invention, the advantages of the light module are:

1. The lighting module can be assembled easily and rapidly.

2. The lighting module has a large heat dissipation area and improves the efficiency of heat dissipation.

3. The lighting module has fewer components and a lower cost.

It should be apparent to those skilled in the art that the above description is only illustrative of specific embodiments and examples of the invention. The invention therefore covers various modifications and variations made to the herein-described structure and operations of the invention, provided they fall within the scope of the invention as defined in the following appended claims.

What is claimed is:

1. A light module comprising:
   a lighting unit having a lead contact;
   a heat-dissipation plate having opposing sides and an outer edge portion extending transversely therebetween, one of said sides being contiguous said lighting unit, said heat-dissipation plate having a channel corresponding to the lead contact, said heat-dissipation plate further having screw threads formed circumferentially about the outer edge portion thereof; and
   an insulative plate disposed on said heat-dissipation plate side opposing said lighting unit , and having a predetermined conductive pattern arranged thereon and a though hole corresponding to the channel;
   wherein the lead contact of the lighting unit penetrates through the channel of the heat-dissipation plate and the through hole of the insulative plate to electrically connect to the predetermined conductive pattern of the insulative plate.

2. The light module as claimed in claim 1, wherein the lighting unit includes an LED.

3. The light module as claimed in claim 1, wherein the lighting unit is fixed to the heat-dissipation plate.

4. The light module as claimed in claim 1, wherein the channel of the heat-dissipation plate is adjacent to the lighting unit, and the lead contact extends downwardly to penetrate the channel.

5. The light module as claimed in claim 1, wherein the channel is spaced from the lighting unit with a predetermined distance, and the lead contact extends outwardly along the predetermined distance and folds downwardly to penetrate the channel.

6. The light module as claimed in claim 1, wherein the insulative plate is made of polypropylene materials.

* * * * *